United States Patent [19]

Jerry

[11] Patent Number: 4,766,050
[45] Date of Patent: Aug. 23, 1988

[54] IMAGING SYSTEM WITH INTEGRAL COVER SHEET

[75] Inventor: Roger E. Jerry, Bellbrook, Ohio

[73] Assignee: The Mead Corporation, Dayton, Ohio

[21] Appl. No.: 32,144

[22] Filed: Mar. 27, 1987

[51] Int. Cl.$^4$ ............................ G03C 1/40; G03C 1/00
[52] U.S. Cl. .................................... 430/138; 430/211; 430/235; 430/541; 430/962
[58] Field of Search ............... 430/138, 211, 235, 962, 430/541

[56] References Cited

U.S. PATENT DOCUMENTS

| | | | |
|---|---|---|---|
| 4,399,209 | 8/1983 | Sanders et al. | 430/138 |
| 4,440,846 | 4/1984 | Sanders et al. | 430/211 |
| 4,532,200 | 7/1985 | Arney et al. | 430/138 |

OTHER PUBLICATIONS

McCutcheon's 1980 Functional Materials. The Manufacturing Confectioner Publishing Co., pp. 143-145.

Primary Examiner—Mukund J. Shah
Attorney, Agent, or Firm—Smith & Schnacke

[57] ABSTRACT

The present invention provides a photosensitive material having a support, a layer containing opacifying agent, a layer containing microcapsules and a layer of developer material. The layer containing opacifying agent, the layer containing microcapsules and the layer of developer material are positioned such that upon rupturing the microcapsules, the color former diffuses to the developer material layer to form an image in the developer material layer. The final image is viewed against the opacifying agent.

12 Claims, 1 Drawing Sheet

IMAGING SYSTEM WITH INTEGRAL COVER SHEET

BACKGROUND OF THE INVENTION

The present invention relates to an imaging system with an integral cover sheet.

Photosensitive imaging systems employing microencapsulated radiation sensitive compositions are the subject of commonly assigned U.S. Pat. Nos. 4,399,209 and 4,416,966 as well as co-pending U.S. patent application Ser. No. 320,643, filed Jan. 18, 1982. These imaging systems are characterized in that an imaging sheet including a layer of microcapsules containing a photohardenable or photosoftenable photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color former. Exposure image-wise hardens the internal phase of the microcapsules. Following exposure, the imaging sheet is subjected to a uniform rupturing force by passing the sheet through the nip between a pair of pressure rollers.

Commonly assigned U.S. Pat. No. 4,440,846 discloses a self-contained system in which the encapsulated color former and the developer material are co-deposited on one surface of a single substrate as one layer or as two contiguous layers. Upon passing the self-contained copy sheet through pressure rollers in contact with the copy sheet, the microcapsules image-wise rupture and release internal phase whereupon the color former migrates to the developer material where it reacts with the developer material and forms a colored image.

SUMMARY OF THE INVENTION

Like the imaging systems disclosed in U.S. Pat. No. 4,440,846, the imaging system of the present invention comprises a support, a layer containing microcapsules and a layer of developer material. Unlike the aforementioned systems, the system of the present invention also comprises a layer containing opacifying agent. The term "opacifying agent" as used herein means a material which effectively masks the microcapsules so that the final image can be viewed without interference therefrom and is light-reflecting so as to provide a white background. The layer containing opacifying agent can form a separate layer or can be part of the layer containing microcapsules or both.

The layer containing opacifying agent, the layer containing microcapsules and the layer of developer material are positioned such that upon rupturing the microcapsules, the color former diffuses to the developer material layer to form an image in the developer material layer. The purpose of the opacifying agent is to provide a white reflective background for the eventual viewing of the final image. The opacifying agent also serves as an anti-abrasion overcoat before lamination and pressure development. Unlike the imaging system described in U.S. Pat. No. 4,399,209, the supports of the present invention need not be separated after pressure development because the final image is viewed through a transparent substrate and, as such, a processing step is eliminated and waste material in the form of used imaging sheets is not created. The present invention also provides for a high gloss effect.

In a preferred embodiment, two outer supports are used which is advantageous because the resulting photosensitive material can be oxygen impermeable. As those skilled in the art know, oxygen inhibition is common when using a monomer-photoinitiator system. As the photoinitiator is activated by either visible light or ultraviolet radiation, the free radicals which are generated react with the oxygen present preventing the monomer from polymerizing. By using two oxygen impermeable outer supports, the photosensitive material is rendered oxygen impermeable and thus, the free radicals react more efficiently.

In accordance with another embodiment of the present invention, an imaging process is provided comprising exposing the aforementioned photosensitive material to actinic radiation. The photosensitive material comprises a support, a layer containing opacifying agent, a layer containing microcapsules wherein the microcapsules contain a color former and a photohardenable or photosoftenable photosensitive composition and a layer of developer material. The microcapsules are ruptured such that the color former diffuses through or from the layer containing the opacifying agent to the developer material to form an image in the developer material layer. The final image is viewed against the layer of opacifying agent.

Thus, an object of the present invention is to provide a photosensitive material including a layer containing an opacifying agent which is permeable to color formers, serves as a background for the eventual viewing of the finished image and serves as an anti-abrasion coating before lamination and pressure development.

A further object of the present invention is to provide a photosensitive material wherein waste in the form of used imaging sheets is not created.

An additional object of the present invention is to provide a photosensitive material having a high gloss surface for viewing.

Another object of the present invention is to provide a photosensitive material which is oxygen impermeable.

Other objects and advantages of the present invention will become apparent from the following description, attached drawings and the appended claims.

DETAILED DESCRIPTION OF THE INVENTION

Figure 1:
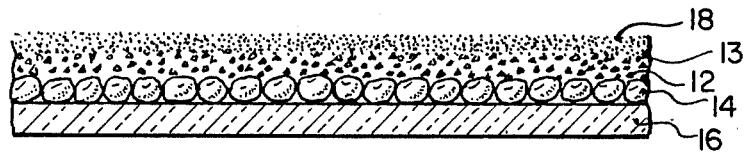
FIGS. 1–6 are cross-sectional views of different embodiments of the photosensitive material of the present invention.
Figure 2:
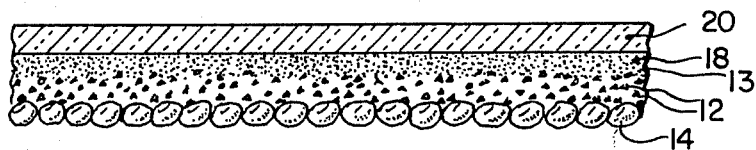
Figure 3:
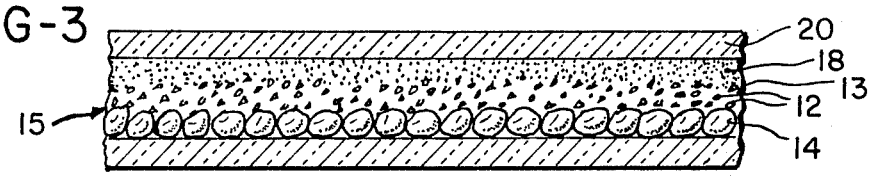

As illustrated in FIGS. 1–3, the opacifying agent 12 is present in a layer 13 which is separate from the layer 15 of microcapsules 14. As shown in FIG. 1 in accordance with one embodiment of the present invention, the layer 15 of microcapsules 14 is interposed between a support 16 and a layer 13 of the opacifying agent 12. The microcapsules 14 are exposed through transparent support 16 to a source of actinic radiation. Further, the layer 13 of opacifying agent 12 is interposed between the layer 15 of microcapsules 14 and a layer of developer material 18. Upon rupturing the microcapsules, the color former is released in the image areas as described in U.S. Pat. No. 4,440,846. The color former diffuses through layer 13 to the developer layer 18 where the image is formed. The image formed in the layer of developer material 18 is viewed with the layer 13 of opacifying agent 12 as background.

In accordance with another embodiment as illustrated in FIG. 2, the support is on the opposite face of the photographic unit of FIG. 1. The layer 13 of opacifying agent 12 is interposed between the layer 15 of microcapsules 14 and the layer of developer material 18. The layer 15 containing microcapsules 14 is exposed to a source of actinic radiation which is adjacent to layer 15. Further, the layer of developer material 18 is interposed between the layer 13 of opacifying agent 12 and the support 20. Color former is released from microcapsules 14, passes through layer 13 to layer 18 where the image is formed. The image formed in the layer of developer material 18 is viewed through transparent support 20 with the layer 13 of opacifying agent 12 as background.

FIG. 3 illustrates a unit designed for oxygen impermeability. In accordance with this embodiment, the photosensitive material comprises in order: a support 16, a layer 15 containing microcapsules 14, a layer 13 containing opacifying agent 12, a layer of developer material 18, and a second support 20. The layer 15 containing microcapsules 14 is exposed through transparent support 16 to a source of actinic radiation which is adjacent to support 16. The image formed in the developer material 18 is viewed through the transparent support 20 with the layer 13 of opacifying agent 12 as background.

Figure 7:
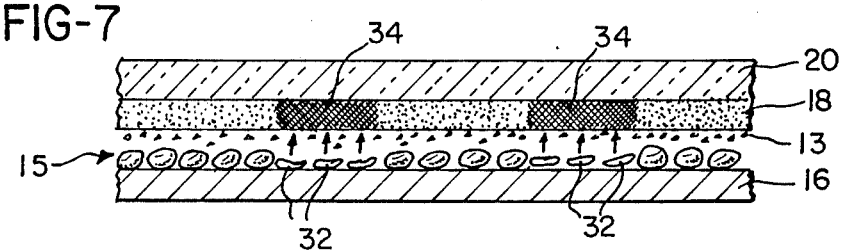
FIG. 7 represents the photosensitive material after exposure and microcapsule rupture.

The operation of the photographic unit illustrated in FIG. 3 is illustrated in more detail in FIG. 7. Imagewise exposure of the photographic unit of FIG. 3 produces exposed microcapsules 30 and unexposed microcapsules 32 in the microcapsule layer 15. Upon subjecting the photographic unit to a uniform rupturing force, the unexposed microcapsules 32 rupture and release the color former. The color former migrates through the layer 13 of opacifying agent 12 as shown by the arrows to the developer layer 18. The color former reacts with the developer in layer 18 to produce a colored image 34. The image is viewed through the transparent support 20.

Figure 4:
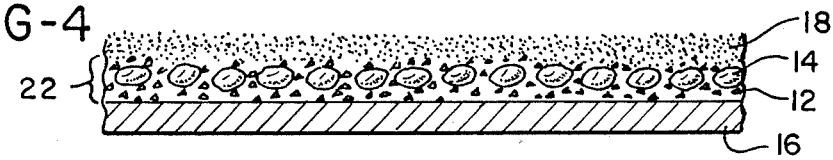
Figure 5:
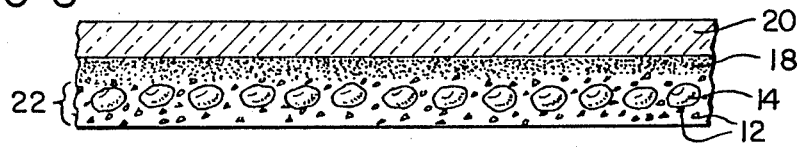
Figure 6:
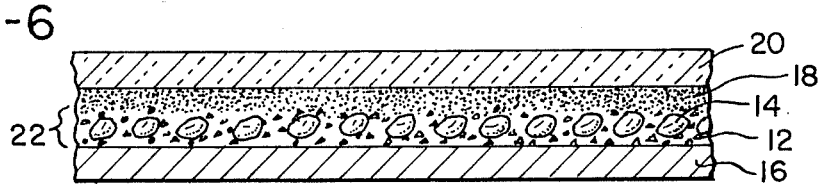

FIG. 4-6 represent another embodiment of the present invention wherein the opacifying agent 12 is dispersed in the layer containing microcapsules 14 to form dispersion 22. As illustrated in FIG. 4 in accordance with one embodiment, the dispersion 22 is interposed between a support 16 and a layer of developer material 18. Depending on the materials used, the microcapsules 14 may be exposed through transparent support 16 or through the layer of developer material 18. The image formed in the layer of developer material 18 is viewed with the dispersion 22 as background.

As illustrated in FIGS. 5 and 6, the support can be on either or both faces of the photographic unit. In FIG. 5 a layer of developer material 18 is interposed between the dispersion 22 and a support 20. The microcapsules 14 are exposed to a source of actinic radiation which is adjacent to the dispersion 22 or through the transparent support 20 to a source of actinic radiation which is adjacent to support 20. The image formed in the layer of developer material 18 is viewed through the transparent support 20 with the dispersion 22 as background.

As illustrated in FIG. 6 in accordance with another embodiment, the photosensitive material comprises in order: a support 16, a dispersion 22 of opacifying agent 12 and microcapsules 14, a layer of developer material 18, and a second support 20. The microcapsules 14 are exposed through transparent support 16 to a source of actinic radiation which is adjacent to support 16 or through transparent support 20 to a source of actinic radiation which is adjacent to support 20. The image formed in the layer of developer material 18 is viewed through the transparent support 20 with the dispersion 22 as background. As mentioned earlier, the embodiment of FIG. 6 is advantageous because the photosensitive material is rendered oxygen impermeable due to the presence of two supports.

The embodiments of FIGS. 4-6 are useful in certain applications but are less preferred than the embodiments of FIGS. 1-3 due to the scattering effect of the opacifying agent 12. FIG. 3 represents the most preferred embodiment of the present invention.

It is also possible to make the imaging system in two units and combine them at the pressure development stage. This binary system may be less costly and simpler in manufacture. Referring to the drawings, the embodiment depicted in FIGS. 3 and 6 could be made this way. For example, in FIG. 3, layers 13 and 15 may be coated on support 16 in one unit, while layer 18 may be coated separately on support 20. In the case of FIG. 6, layer 12 may be coated on support 16, while layer 18 may be coated separately on support 20. This could be advantageous, because it is easier to coat one layer at a time than multiple layers. When either of these systems is pressure developed, they will form integral units identical to the ones depicted (FIG. 3 & FIG. 6, respectively).

The opacifying agent 12 is an inert, light reflecting agent which is present in a layer which is permeable to the color formers which are released from the microcapsules 14. The dye image is formed in the layer of the developer material 18 and is seen with the opacifying agent 12 as a white background. Useful materials for the opacifying agent 12 include inert, light-scattering white pigments such as titanium dioxide, magnesium carbonate, or barium sulfate. In a preferred embodiment, the opacifying agent 12 is titanium dioxide.

Useful photohardenable and photosoftenable compositions, photoinitiators, chromogenic materials, carrier oils and encapsulation techniques for the layer of microcapsules 14 are disclosed in U.S. Pat. No. 4,399,209 which is herein incorporated by reference. Preferred photosensitive compositions are described in commonly assigned U.S. patent application Ser. No. 917,873 filed Oct. 10, 1986.

For the embodiments illustrated in FIGS. 4-6, the microcapsules 14 contain a sensitizer which should be colorless or photobleachable. Where the photosensitive composition is not sensitive to visible light, for example, compositions sensitive in the far UV region, the sensitizer is colorless. In using visible light sensitive compositions, or compositions sensitive in the near UV and blue regions, the sensitizer used in FIGS. 4-6 is colored and therefore is preferably photobleachable. Otherwise, the sensitizer will tint the background. For example, microcapsule formulations which are sensitive in the region of 340 to 500 nm of the visible spectrum are yellow in color due to the spectral sensitivity of the internal phase and more particularly, the photoinitiator system. Because the supports of the present invention are not separated after pressure development, the presence of yellow microcapsules imparts a yellow tint to the viewing background and aesthetically detracts from the image. Thus, the microcapsules 14 preferably contain a photobleachable sensitizer which is sensitive in the 390-500 nm portion of the spectrum and imparts a yellow hue to the imaging sheet but which can be bleached upon exposure to fluorescent (ultraviolet) light following development.

Because the sensitizer is used in a relatively small amount, in some cases and for some applications, the color of the sensitizer may not seriously detract from the image and photobleachable sensitizers would not be required. Useful photobleachable sensitizers are disclosed in commonly assigned U.S. patent application Ser. No. 939,270 filed Dec. 10, 1986.

A photobleachable sensitizer is unnecessary in the embodiments illustrated in FIGS. 1–3 because the image is viewed with the layer 13 of the opacifying agent 12 as the white background which covers the microcapsules 14. In contrast, in FIG. 4, the image formed in the layer of developer material 18 is viewed with the dispersion 22 as background and in FIGS. 5–6, the image formed in the layer of developer material 18 is viewed through the transparent support 20 with the dispersion 22 as background so that the color of the microcapsules 14 may be present in the background of the image formed in the layer of developer material 18. If a developer resin 18 is used which clears upon heating, photobleaching the sensitizer and clearing the developer resin 18 can be accomplished in one treatment, for example with a bright, hot liquid source, such as a tungsten halogen lamp may be used to bleach the sensitizer and coalesce the developer.

As illustrated in FIGS. 1 and 3, support 16 must be transparent or translucent in order for the layer 15 of microcapsules 14 to be exposed to actinic radiation through the transparent support 16. Useful transparent substrates are known in the art and include polyethylene terephthalate. In the embodiments illustrated in FIGS. 4 and 6, support 16 can be opaque as illustrated or transparent. Depending on the light-transmitting characteristics of the developer, the microcapsules 14 may be exposed through support 20 and developer layer 18. For example, certain phenolic developer resins may be sufficiently transparent to permit exposure through support 20. Other developers may not. Useful opaque substrates for support 16 include paper which may be a commercial impact raw stock or a special grade paper such as cast-coated paper and chrome rolled paper.

The developer material 18 used in the present invention is a compound or material capable of reacting with the chromogenic material to produce a color image. In the most typical case, the developer material is an electron accepting compound or a so-called color developer. In the broadest sense, however, the term "developer material" as used herein refers to that half of the color-forming reactant combination which is not encapsulated with the photosensitive composition. Hence, as stated before, compounds conventionally recognized as color developers can be encapsulated as the chromogenic material in the present invention, and compounds conventionally recognized as color formers can be used outside the capsule in the invention system.

The developer materials used in the present invention are those conventionally employed in carbonless paper technology and are well known. Illustrative specific examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts of phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate, etc. and mixtures thereof. Another class of phenolic resin useful in the present invention is the products of oxidative coupling of substituted or unsubstituted phenols or biphenols such as the resins described in commonly assigned and recently allowed U.S. patent application Ser. No. 797,585, filed Nov. 13, 1985. Preferred developer resins are disclosed in commonly assigned U.S. patent application Ser. No. 905,727, filed Sept. 9, 1986.

In the embodiments illustrated in FIGS. 2, 3, 5 and 6, the image in the layer of developer material 18 is viewed through the transparent support 20 which allows the image to be viewed without removal of the support 20. Useful transparent substrates for support 20 include polyethylene terephthalate.

A UV-absorbing dye can be incorporated into support 20 in order to reduce image fading in a manner known in the art. An anti-reflection overcoat might be included for ease of viewing and reduction of surface reflections.

The term "actinic radiation" as used herein includes the full spectra of electromagnetic radiation including ultraviolet, infrared, the entire visible spectrum as well as gamma radiation and ion beam radiation. The preferred forms of actinic radiation are ultraviolet radiation and visible light having a wavelength of 190 to 900 nm.

Typically, the layer containing microcapsules 14 is ruptured by passing the photosensitive material through a nip between two pressure rollers. Other useful means for rupturing the microcapsules 14 are disclosed in commonly assigned U.S. Pat. Nos. 4,448,516; 4,533,615; 4,578,340; 4,592,986 and U.S. patent application Ser. No. 010,922, filed Feb. 5, 1987. Means relying on shear alone will only be useful when the microcapsules are at the surface of the photographic unit.

Having described the invention in detail and by reference to preferred embodiments thereof, it will be apparent that modifications and variations are possible without departing from the scope of the invention defined in the appended claims.

What is claimed is:

1. A photosensitive material comprising:
   a support,
   a layer containing opacifying agent,
   a layer containing microcapsules wherein said microcapsules contain a color former and a photohardenable or photosoftenable photosensitive composition, and
   a layer of developer material; wherein said layer containing opacifying agent, said layer containing microcapsules, and said layer of developer material are positioned such that upon rupturing said microcapsules, said color former diffuses to said developer material layer to form an image in said developer material layer and said image is viewed against said layer containing opacifying agent and said layer containing opacifying agent shields said microcapsules from said image.

2. The photosensitive material of claim 1 wherein said material comprises in order: a transparent support, said layer containing microcapsules, said layer containing opacifying agent, and said layer of developer material.

3. The photosensitive material of claim 1 wherein said material comprises in order: a transparent support, said layer of developer material, said layer containing opacifying agent, and said layer containing microcapsules.

4. The photosensitive material of claim 2 which comprises in order: a first transparent support, said layer containing microcapsules, said layer containing opacifying agent, said layer of developer material, and a second transparent support.

5. The photosensitive material of claim 4 wherein said opacifying agent is an agent selected from the group consisting of titanium dioxide, magnesium carbonate, and barium sulfate.

6. The photosensitive material of claim 1 wherein said layer containing microcapsules and said layer containing opacifying agent are combined as one layer.

7. The photosensitive material of claim 6 wherein said combined layer is interposed between said support and said layer of developer material.

8. The photosensitive material of claim 6 wherein said layer of developer material is interposed between said combined layer and said support.

9. The photosensitive material of claim 6 which comprises in order a first support, said combined layer, said layer of developer material, and a second support.

10. The photosensitive material of claim 9 wherein at least one of said first and second supports is transparent such that said layer of microcapsules can be exposed to actinic radiation through said transparent support.

11. The photosensitive material of claim 6 wherein said microcapsules additionally comprise a photobleachable sensitizer.

12. An imaging process comprising:
exposing a photosensitive material to actinic radiation wherein said photosensitive material comprises a support, a layer containing opacifying agent, and a layer containing microcapsules wherein said microcapsules contain a color former and a photohardenable or photosoftenable photosensitive composition and a layer of developer material; and
rupturing said microcapsules such that said color former diffuses to said developer material layer to form an image in said developer material layer and said image is viewed against said opacifying agent.

* * * * *